United States Patent
Meister

4,070,506
Jan. 24, 1978

[54] METHOD FOR APPLYING CONTAINED PATTERN COMPOSITION FOR SOLDERING

[75] Inventor: Frank X. Meister, Chicago, Ill.

[73] Assignee: Sod-r Stop, Inc., Chicago, Ill.

[21] Appl. No.: 743,572

[22] Filed: Nov. 22, 1976

[51] Int. Cl.$^2$ ............................................. C09D 5/20
[52] U.S. Cl. ...................................... 427/156; 106/2; 106/15 FP; 427/259
[58] Field of Search .................. 106/2, 15 FP, 287 S, 106/291; 427/154, 156, 259; 424/157, 158

[56] References Cited
U.S. PATENT DOCUMENTS

| | | | |
|---|---|---|---|
| 3,347,744 | 10/1967 | Latshaw et al. | 424/157 |
| 3,591,680 | 7/1971 | Greene et al. | 424/158 |
| 3,882,232 | 5/1975 | Pendergrast | 424/158 |

FOREIGN PATENT DOCUMENTS

| | | | |
|---|---|---|---|
| 957,455 | 11/1974 | Canada | 106/15 FP |
| 433,694 | 5/1934 | United Kingdom | 424/157 |

*Primary Examiner*—Lorenzo B. Hayes
*Attorney, Agent, or Firm*—Dominik, Knechtel, Godula & Demeur

[57] ABSTRACT

A method for applying a contained pattern to prevent solder overrun by applying a composition which can be applied in liquid form to a work surface where it dries, and subsequent soldering on said work surface will be substantially limited to the pattern laid down by the composition so that there is no solder overrun. The composition also has useful fire retardant properties which protects the underlying work surface. Such composition is a mixture of magnesium hydroxide, water and mica in the laminated silica mineral form.

4 Claims, No Drawings

METHOD FOR APPLYING CONTAINED PATTERN COMPOSITION FOR SOLDERING

FIELD OF THE INVENTION

This invention relates broadly to the work surface treatment art, particularly treatment of work surfaces with liquid compositions which dry to assume the pattern in which the liquid composition was laid down. Such liquid composition broadly protects the work surface as a fire retardant material, and more importantly provides a contained pattern for soldering so that the solder substantially does not overrun the laid down pattern but builds up on such pattern.

BACKGROUND AND RELEVANT ART UNCOVERED BY APPLICANT

Products have been introduced on the market to prevent solder overrun when such solder is melted on a work surface, as splitting wires, attaching electrical components, attaching components to a base or the like. Applicant's search of the relevant art have not led to relevant discoveries, and represntative art may be listed such as U.S. Pat. No. 3,396,457 where epoxy casting material is suggested as providing a resist area where solder does not attach itself. In a sense this is a solder resist material which is quite distinct from the present invention. U.S. Pat. No. 2,990,310 similarly speaks generally of a solder resist material without identifying the source.

OBJECTS AND ADVANTAGES OF THE INVENTION

An object of the invention is to provide an improved composition which can be laid down in liquid form on a work surface, including wires, boards, metal bases, copper plates, or the like so that melted solder in the area of said contained pattern is laid down on the pattern and builds up on the pattern but does not overrun the pattern.

Yet another object of the invention is to provide a contained pattern composition for soldering, and to realize additional advantages from the composition for related use, particularly fire retardant properties.

Still yet another object of the invention is to provide such an improved contained pattern composition to prevent solder overrun which usefully operates on a wide variety of metals in which solder overrun is usually a problem and which composition is relatively simple to prepare from relatively few ingredients which are non-toxic so the composition may be easily handled and applied in use. A further advantage is that the dried composition is readily water soluble so it can be quickly removed.

SUMMARY OF THE INVENTION

It has been found that combining mica in the laminated silica mineral form with commercial Milk of Magnesia results in a highly useful composition which serves as a contained pattern composition for solder overrun. It has also been found that such a composition has highly useful fire retardant properties. Commercial Milk of Magnesia is 7% magnesium hydroxide by weight in water and such magnesium hydroxide is a fine size so it maintains a relatively stable suspension. The mica is a fine silica so the resulting composition can be quickly prepared, can be easily handled, is non-toxic, and is easily applied to a working surface as by brushing, spraying or the like.

In one form, the mica is added from about one-half to about 2 parts by volume to commercial Mild of Magnesia which is present from 9½ to 8 parts by volume. In preferred form, about one part of the silica is added to about 9 parts of the commercial Milk of Magnesia. A trace amount of vegetable coloring may be added for aesthetic color effect.

In another form, fine particle size magnesium hydroxide in about 5 to about 10 parts by weight of magnesium hydroxide may be combined with about 85 to about 75 parts by weight of water, and to this mixture is added from about 20 parts to about 5 parts by weight of the silica in the laminated silica mineral form. In preferred form about one part of magnesium hydroxide is combined with about 8 parts by volume of water and about one part by volume of mica. Again, if desired, trace amounts of vegetable coloring may be added for attractive appearance.

The actual proportions are in no sense critical but merely represent preferred ranges which lead to useful compositions which are in liquid form, and which are preferably shaken before application. Once shaken, a relatively stablized suspension of the magnesium hydroxide in water is applied readily as a liquid to the work surface, allowed to dry, and then soldering is done without objectionable overrun.

DETAILED DESCRIPTION OF THE INVENTION

The following examples are presented as representative teachings of useful proportions, but it should be understood that such amounts may be varied while still realizing the advantages of the invention.

Example I

| Ingredient | Volume | % by Volume |
|---|---|---|
| Mica (laminated silica mineral form) | 15 mm | 11% |
| 7% magnesium hydroxide in water | 115 ml | 88% |
| Food color, red | 1- 2 ml | less than 1% (trace) |

The above composition is readily prepared by merely admixing the various ingredients. The composition is shaken just before use, although suspension is relatively stable and great shaking is not required. A brush is used to apply the liquid composition to adjoined wires which are to be soldered and the liquid composition is allowed to dry. Solder is melted over the contained pattern of dried composition and the solder builds up on said contained pattern without overrun. The dried composition pattern can be removed by water washing if not laid down as desired, or after soldering is completed. It is readily water soluble.

Example II

| Ingredient | Grams | % by Weight |
|---|---|---|
| Magnesium hydroxide | 8 | 6.5% |
| Water | 110 | 88% |
| Mica (laminated silica Mineral form) | 7 | 5.5% |
| Food coloring, red | trace | less than 1% (trace) |

In similar fashion the above ingtedients are readily admixed, and the composition is shaken slightly just prior to use. The composition is applied to liquid form to a copper and metal sheet in a contained circular pattern, and solder is melted over the pattern wherein it builds up on the pattern without any substantial overrun.

The mica used in the foregoing compositions was obtained from a supplier using the tradename Perfection Mica, Bensenville, Illinois.

The above composition results in a quite stable composition which only shows settling after long shelf life without disturbance, but a relatively stable suspension is readily reestablished by a simple shaking prior to use. The claims of the invention are now presented and the terms of such claims may be further understood by reference to the language in the preceding specification.

What is claimed is

1. A process for applying a pattern to prevent solder overrun to a metal work surfaceto be soldered comprising the steps of
    providing a metal work surface which incorporates elements to be soldered,
    providing a composition consisting essentially of about one-half to about 2 parts by volume of a laminate silicate mineral and about 9½ to about 8 parts by volume of a solution of magnesium hydroxide in water, said magnesium hydroxide present in said solution from about 3% by weight to about 12% by weight, said laiminated silicate material being dissolved in said magnesium hydroxide solution,
    applying said liquid composition to the area on said work surface wherein the soldering is to be effected,
    permitting said composition as applied to said work surface to dry,
    and removing any of the residual dried pattern composition by applying water to said composition subsequent to soldering.

2. The process as set forth in claim 1 above, wherein said laminated silica material in said composition is in granular form and comprises about 1 part by volume of said composition, and said solution of magnesium hydroxide in water comprises about 9 parts by volume of said composition.

3. A process for applying a pattern to prevent solder overrun to a metal work surface to be soldered comprising the steps of;
    providing a metal work surface which incorporates elements to be soldered,
    providing a composition consisting essentially of about 6 parts by weight of magnesium hydroxide, about 88 parts by weight of water, and about 6 parts by weight of laminated silica,
    applying said liquid composition to the area on said work surface wherein the soldering is to be effected,
    permitting said composition as applied to said work surface to dry,
    and removing any of the residual dried pattern composition by applying water to said composition subsequent to soldering.

4. A process for applying a pattern to prevent solder overrun to a metal work surface to be soldered comprising the steps of;
    providing a metal work surface which incorporates elements to be soldered,
    providing a composition consisting essentially of about one-fourth to about 2 parts of magnesium hydroxide, about 9 ½ to about 7 parts of water, and about one-fourth to about 3 parts of mica in the form of laminated silica material,
    applying said liquid composition to the area on said work surface wherein the soldering is to be effected,
    permitting said composition as applied to said work surface to dry,
    and removing any of the residual dried pattern composition by applying water to said composition subsequent to soldering.

* * * * *